United States Patent [19]

Hsieh et al.

[11] 4,386,403
[45] May 31, 1983

[54] SYSTEM AND METHOD FOR LSI CIRCUIT ANALYSIS

[75] Inventors: Hsueh Y. Hsieh, Hopewell Junction; Naguib B. G. Rabbat, Wappingers Falls, both of N.Y.

[73] Assignee: International Business Machines Corp., Armonk, N.Y.

[21] Appl. No.: 108,911

[22] Filed: Dec. 31, 1979

[51] Int. Cl.³ .............................................. G06F 15/20
[52] U.S. Cl. ................................................. 364/300
[58] Field of Search ................. 364/200 MS File, 300

[56] References Cited

U.S. PATENT DOCUMENTS 3,653,072  3/1972  Ballas et al. ....................... 364/300

OTHER PUBLICATIONS

Shalla, L., "Automatic Analysis of Electronic Digital Circuits Using List Processing", Comm. of the ACM, vol. 9, No. 5, May 1966, pp. 372-380.

Dammkoehler, R. A., "A Macromodular Systems Simulator (MSZ)", Spring Joint Computer Conf., 1967, pp. 371-376.

Primary Examiner—Gareth D. Shaw
Assistant Examiner—Thomas M. Heckler
Attorney, Agent, or Firm—Edward S. Gershuny

[57] ABSTRACT

A system and method for analysis of circuits which include a large number of circuit elements. Blocks of circuitry which define logical circuit functions such as gates and latches are set up as macromodels. Each macromodel need be represented in its full detail only once. Means are provided to recognize latency, or quiescence, of macromodels so that time may be saved in the circuit analysis when a macromodel is latent.

9 Claims, 26 Drawing Figures

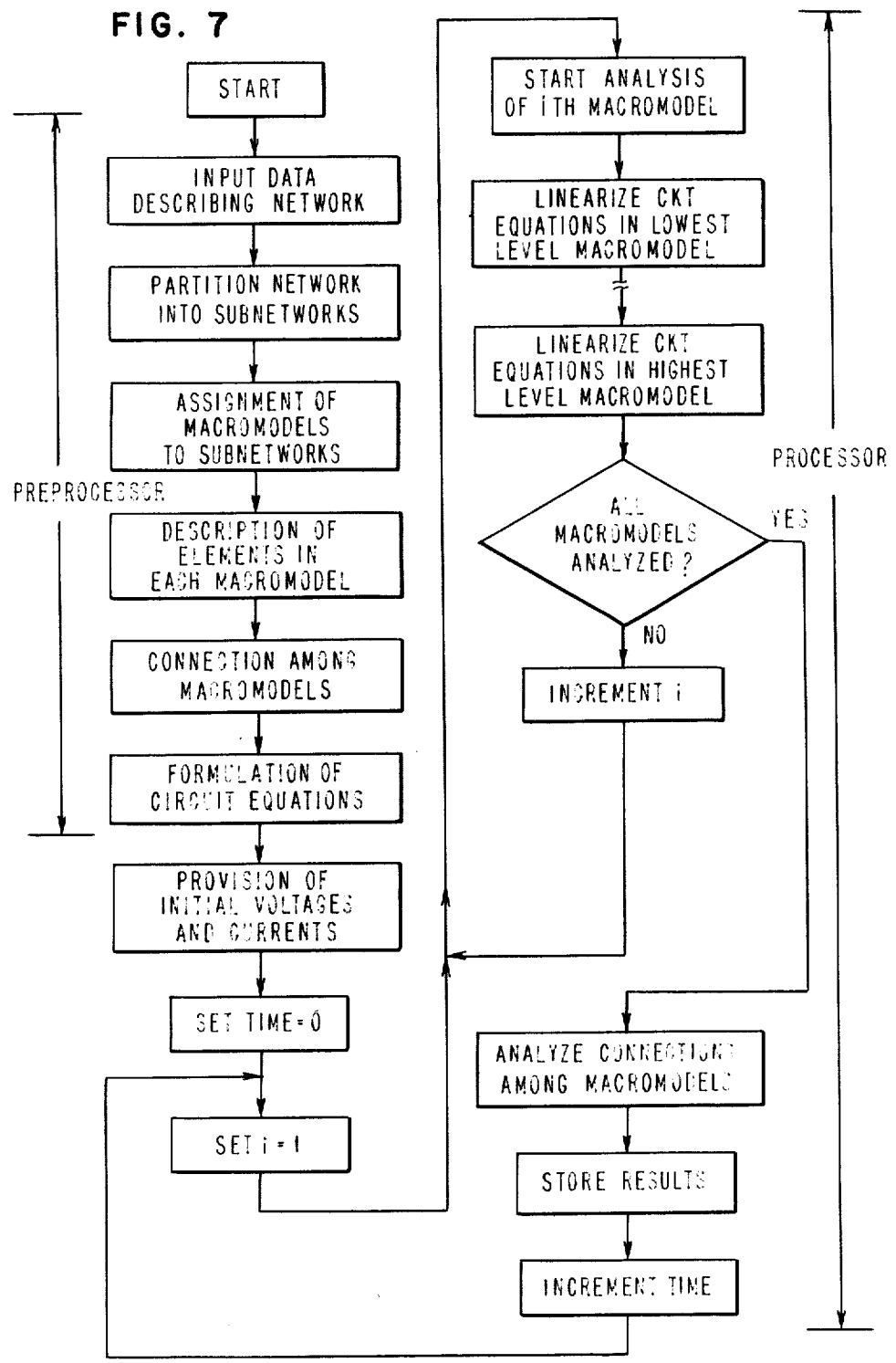

FIG. 8 NOR CIRCUIT
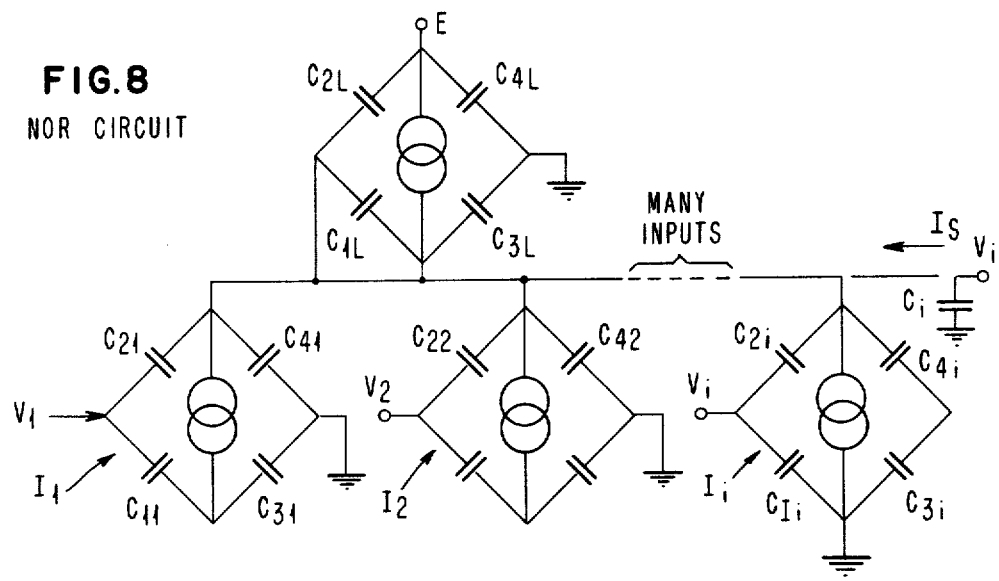
FIG. 9 NAND CIRCUITS
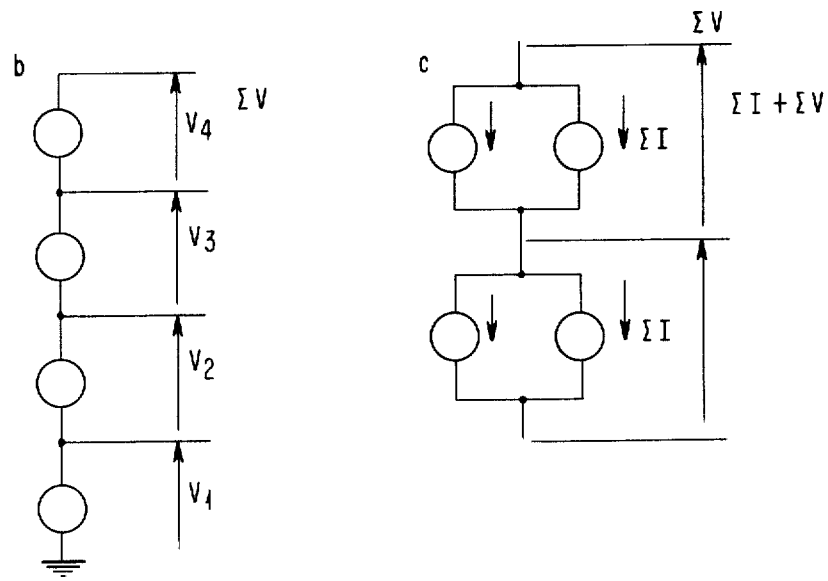

NESTING OF MICROMODELS

SYSTEM AND METHOD FOR LSI CIRCUIT ANALYSIS

INTRODUCTION

This invention relates to systems for analyzing large circuit networks. More particularly, the invention relates to apparatus and methods for verifying the adequacy of designs of circuits having a very large number of very small closely spaced elements such as are found on large scale integration (LSI) chips.

As part of the design phase of LSI chips, manufacturers commonly study various designs by simulating them in order to help confirm their practicality and manufacturability. The simulations, which may utilize special purpose hardware or programmed general purpose computers, can help to identify logical problems (such as, for example, race conditions) and environmental problems (such as, for example, excess power dissipation) which could lead to malfunction and/or failure of the LSI chip.

A typical simulation system takes into account every interconnection of every element in the LSI network and generates data concerning the network and its constituent elements over a long period of time.

The typical prior art, whether it be embodied in special purpose hardware or programmed general purpose hardware, requires vast storage resources to hold all of the element interconnection data and, because of the number and complexity of the computations it must perform, requires a long time to provide a reasonably complete simulation analysis of an LSI circuit design. Since an LSI circuit design may go through many iterations between the first design and the one that is finally accepted for manufacturing, and because each of the iterations will typically be subjected to the simulation analysis, the very large storage and time requirements of prior art analysis apparatus and methods results in the simulation being a significant part of the total expense in designing and manufacturing LSI chips.

SUMMARY OF THE INVENTION

In accordance with a preferred embodiment of this invention, the amount of data that must be maintained in the analysis system is significantly lessened by the use of macromodels. A macromodel is a block of circuitry which is repetitively used on the LSI chip. Instead of maintaining one complete description of the block for each time it appears on the LSI chip, the complete description (that is, the recitation of all of the elements and their interconnections which comprise the block) is maintained only once and is defined as a "macromodel". Other uses of that particular block on the LSI circuit can then be identified by a name assigned to the macromodel.

In accordance with another significant aspect of the preferred embodiment, the time involved in completing a simulation is substantially reduced by the provision of means to recognize that a particular portion of the circuit has become latent, or quiescent, and portions of the simulation can therefore be simplified or deleted. Latency is recognized by providing means for determining that the external parameters which act upon a given macromodel have not changed significantly within a certain period of time, and that the internal parameters of the macromodel have also not changed significantly during that same period of time. Once these two conditions have been established, the internal parameters of the macromodel will be presumed not to be changing so long as the external parameters do not change. For each computational iteration involved in the simulation, the existence of latent macromodels will substantially decrease the computation time.

The primary advantages of this invention stem from its reduction in the amount of information that must be retained in the system and from its reduction in the amount of computation required at various stages.

Macromodeling provides the additional advantage that it facilitates testing of certain design changes in the LSI chip. For example, if the design of a particular gate is altered, and that gate has been established as a macromodel, the change can be entered into the simulation system merely by changing the single definition of the macromodel. This will automatically include the change in every part of the LSI design that refers to that particular macromodel.

BRIEF DESCRIPTION OF THE DRAWINGS

In the accompanying drawings forming a material part of this disclosure:

FIG. 7 is a general logic flow diagram illustrating operation of this invention.

FIG. 8 shows an equivalent circuit representation of a NOR.

FIGS. 9a, 9b and 9c show three variations of equivalent circuit representations of a NAND circuit.

DETAILED DESCRIPTION

Figure 1:
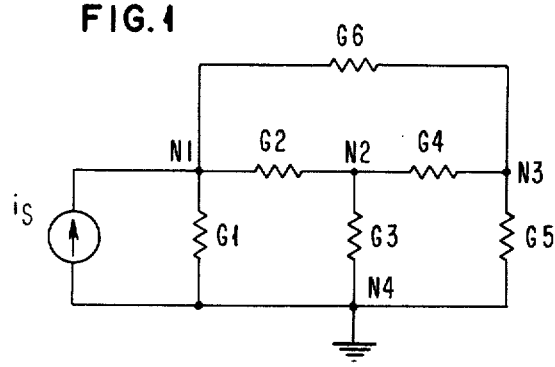
FIG. 1 is an exemplary circuit used to help describe the application of Kirchhoff's Current Law.

For further comprehension of this invention, and of the objects and advantages thereof, reference will be had to the following description and accompanying drawings, and to the appended claims in which the various novel features of the invention are more particularly set forth.

This invention provides a method and apparatus for analyzing, by simulation, the design of large circuits. The invention can be implemented in special purpose hardware designed specifically for this analysis, or it can be implemented by providing an appropriate computer program to a general purpose computer. A preferred embodiment of the invention utilizes a computer program written in the FORTRAN language for an IBM System/370 Model 168 computer.

A complete description of the program which is part of the preferred embodiment of this invention is contained in the detailed listing which forms the final portion of this specification. However, those skilled in the art will have no need to refer to that detailed listing. Rather, they will recognize that the following description of the preferred embodiment contains all the information needed for those skilled in the art to make and use the invention.

DESCRIPTION OF THE PREFERRED EMBODIMENT

Input

First, the description of the LSI network topology must be provided. The connections of each individual circuit element are first described by giving a "from" to "to" node connectivity. For example, a resistance R between node A and B is described by R, A − B = value. These detailed descriptions of all the elements within a block of circuitry provide a complete description of the block. The blocks are selected to be functions on the LSI chip such as, for example, NOR blocks, NAND blocks, latches, etc. These digital blocks are called MACRO blocks. After the circuit elements inside a MACRO block are described, the parameters associated with the circuit elements inside the MACRO block are described as follows, P = FUNCTION (arguments).

The network topology is then described by connecting the MACRO blocks as follows, BB = NOR(BA) where the output node BB of the MACRO block "NOR" is connected to the input node BA of another MACRO block. Therefore there are two types of connectivity (i) the connectivity among the individual elements inside each MACRO block; (ii) the connectivity among the MACRO blocks.

PARTITIONING

The input data defines a partitioning of the total network into subnetworks. The MACRO blocks input data which the user describes are stored into arrays defining each MACRO block as a subnetwork.

MACROMODEL

A subnetwork becomes a "macromodel circuit" when all the internal nodes and branches are assigned array locations unique to the node voltages and branch currents, and all the internal elements, such as capacitances, resistances and others, are assigned locations in the circuit topology. The macromodel circuit can then be used to represent each subnetwork that has the same elements, topology and parameters. In a typical LSI network, there will be many subnetworks all of which can be represented by a single macromodel circuit.

EQUATION FORMULATION

For each macromodel, circuit equations are formulated using, in the preferred embodiment, Kirchhoff's Current Law, the sum of the currents flowing from a node equals the sum of the currents flowing into the node. As an example, consider the linear resistive network shown in FIG. 1. Using the basic branch relationship current equals conductance times voltage (i=Gv) a summation of currents flowing away from each node yields the following equations.

--- node N1: $G1V1 + G2(V1-V2) + G6(V1-V3) = i_s$
node N2: $G2(V2-V1) + G3V2 + G4(V2-V3) = 0$
node N3: $G6(V3-V1) + G4(V3-V2) + G5V3 = 0$

--- where V1, V2 and V3 are the voltages at nodes N1, N2 and N3, respectively. The summation at the arbitrarily chosen "ground" node N4 need not be written because the voltage of that node is zero by definition. In matrix form, we can write the above equations $$\begin{bmatrix} (G1+G2+G6) & (-G2) & (-G6) \\ (-G2) & (G2+G3+G4) & (-G4) \\ (-G6) & (-G4) & (G4+G5+G6) \end{bmatrix} \begin{bmatrix} V1 \\ V2 \\ V3 \end{bmatrix} = \begin{bmatrix} i_s \\ 0 \\ 0 \end{bmatrix}$$

The LU factorization or Gauss elimination procedure attempts to solve from the voltages V1, V2 and V3. The above matrix can be rewritten as $$\begin{bmatrix} a11 & a12 & a13 \\ a21 & a22 & a23 \\ a31 & a32 & a33 \end{bmatrix} \begin{bmatrix} V1 \\ V2 \\ V3 \end{bmatrix} = \begin{bmatrix} b1 \\ b2 \\ b3 \end{bmatrix}$$

In the preferred embodiment, the procedure for solving these equations begins by eliminating V1 from all the equations. First, divide the first equation by all. Then subtract a21 times this result from the second equation, and subtract a31 times the first result from the third equation. After the term-by-term subtractions, we have $$\begin{bmatrix} 1 & (a12/a11) & (a13/a11) \\ 0 & (a32 - a31a12/a11) & (a23 - a21a13/a11) \\ 0 & (a32 - a31a12/a11) & (a33 - a31a13/a11) \end{bmatrix} \begin{bmatrix} V1 \\ V2 \\ V3 \end{bmatrix} =$$

$$\begin{bmatrix} b1/a11 \\ b2 - a21b1/a11 \\ b3 - a31b1/a11 \end{bmatrix}$$

If we then divide the second equation by (a22-a21a12/all) and subtract (a32-a31a12/all) times the result from the third equation, the resulting matrix will be in the "upper triangular form" as shown below.

$$\begin{bmatrix} 1 & A12 & A13 \\ 0 & 1 & A23 \\ 0 & 0 & 1 \end{bmatrix} \begin{bmatrix} V1 \\ V2 \\ V3 \end{bmatrix} = \begin{bmatrix} B1 \\ B2 \\ B3 \end{bmatrix}$$

where A12, A13, A23, B1, B2 and B3 are the new terms resulting from the above steps. Inspection of the above matrix shows that V3 = B3. Using this value of V3 in the second equation, V2 is readily found. Then the values of V3 and V2 can be used in the first equation to find V1.

A more generalized version of this procedure is presented hereinafter.

CIRCUIT ANALYSIS

Figure 2:
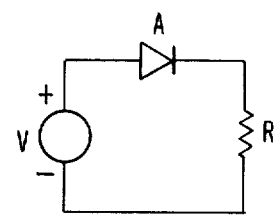
FIG. 2 is a simple circuit containing a non-linear element and a linear element.
Figure 3:
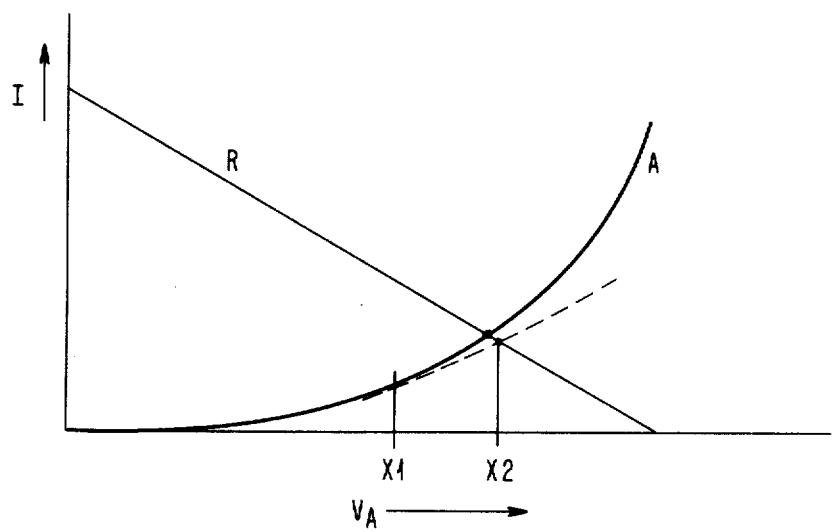
FIG. 3 is a graphical analysis used in explaining linearization of equations.

In the preferred embodiment, effective utilization is made of a multi-level Newton scheme in conjunction with implicit integration. The Newton scheme is used to find an approximate solution to non-linear equations by "linearizing" the equation at a point in time. This is done by approximating the equation by its slope at some starting point. For example, consider the simple circuit of FIG. 2 which contains non-linear device A and linear device R. The graph in FIG. 3 shows, on line A, the current through device A as a function of the voltage across device A. Line R shows the current through device R as a function of the voltage across device A. The intersection of lines A and R will define the voltage and current in the circuit of FIG. 2. Using the Newton method, a first approximation to the solution is found by linearizing line A at a starting point X1 by setting line A equal to its slope at that point. The intersection with line R at point X2 is the approximate solution. To increment the time and get a next solution, implicit integration is used to set time into discrete quantities and implicitly represent the time derivative as a function of the history of past values.

ITERATIONS AND LATENCY

In the preferred embodiment, the determination of circuit parameters at successive instants in time utilizes three key techniques: latency, multi-level Newton approximations and iterative computation. Each of these techniques is described below.

Figure 4:
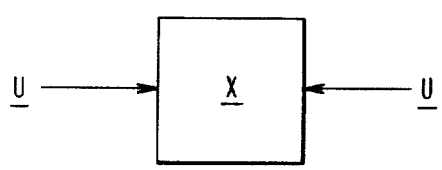
FIG. 4 illustrates the definition of internal and external stimulii.

(1) Latency (or inactivity): Consider the block shown in FIG. 4. If U is the vector of input variables or stimulii and X is the vector of internal variables, the circuit is defined as "latent" if $$U(t_{n-1}) - U(t_{n-k}) \leq \epsilon_1 \quad \text{(i)}$$

that is, the history of the stimulli has not changed over a given number of time periods, and $$X(t_{n-1}) - X(t_{n-j}) \leq \epsilon_2 \quad \text{(ii)}$$

that is, the history of the internal response has not changed over a given number of time periods. Then, if $$U(t_n) - U(t_{n-1}) \leq \epsilon_1 \quad \text{(iii)}$$

the present stimuli have not changed, and it will be assumed the circuit is latent and $$X(t_n) = X(t_{n-1}).$$

The circuit will be regarded as latent as long as its stimulii do not change, that is, as long as $$U(t_n) - U(t_{n+j}) \leq \epsilon_1.$$

As long as the circuit is latent, there is not need to recompute the internal response X.

For the preferred embodiment of this invention, the definition of latency includes a small allowable change $\epsilon_1$ in the stimulii and a small allowable change $\epsilon_2$ in the internal variables. Of course, this is an approximation; *absolute* latency would require $\epsilon_1 = 0$ and $\epsilon_2 = 0$. However, those skilled in the art will recognize that the definition presented here, where some small change is allowable, will tend to increase the occurrences of latency, thus reducing the time to complete a simulation.

Figure 5:
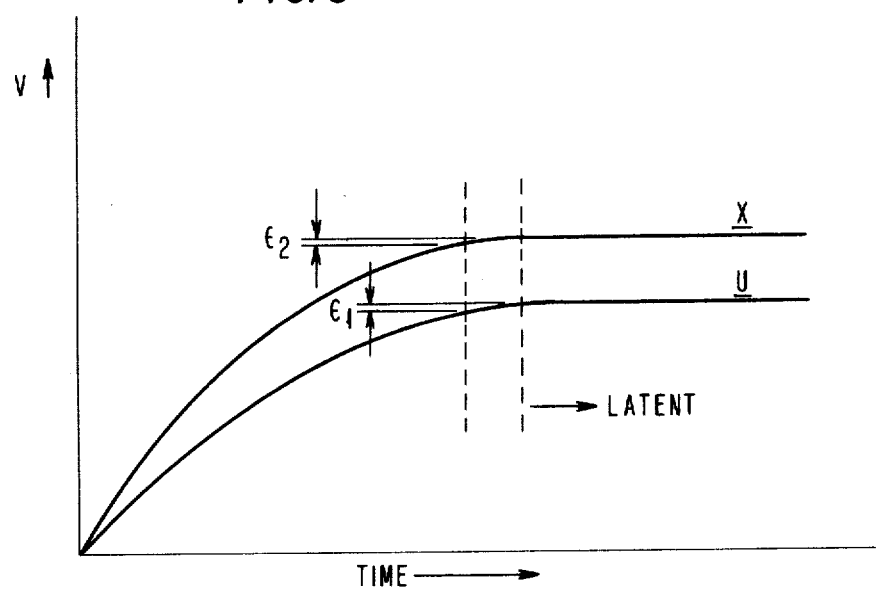
FIG. 5 illustrates the definition of circuit latency.

The extent to which precision can be traded for speed of execution will depend upon the particular application. Values of $\epsilon$ can even vary between macromodules within a single network. The above definitions are illustrated graphically in FIG. 5.

Figure 6:
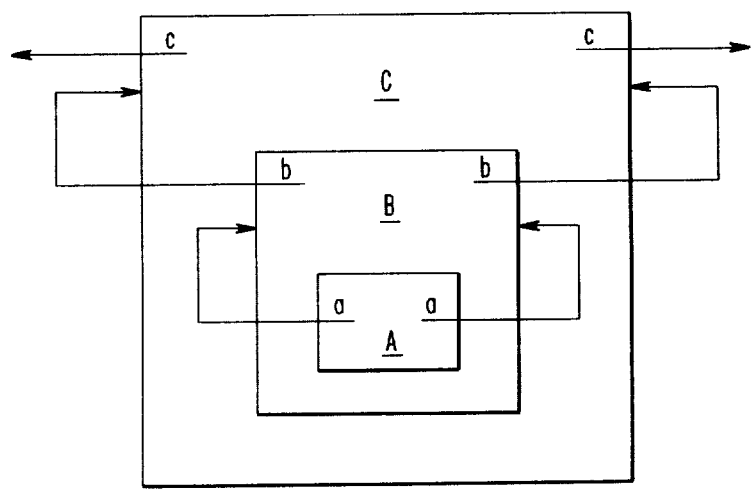
FIG. 6 illustrates a multi-level hierarchy of macromodels.

(2) Multi-level Newton approximations: The multi-level technique applies Newton approximations in a hierarchial fashion, that is, the lowest level circuit is first linearized, then its contribution is "plugged-in" to a higher level circuit. The higher level circuit is then linearized and its contribution is "plugged-in" to a still higher level circuit. Each Newton approximation thus can provide input to still another Newton approximation. This is illustrated in FIG. 6 in which a low level circuit A is shown as having parameters a which were determined using Newton approximations. The parameters a are then used in computing the parameters b of higher level circuit B, again using Newton approximations. Parameters b will then be used in a further Newton approximation to compute parameters c for highest level circuit C. Although this example shows a three-level hierarchy, those skilled in the art will recognize that the number of levels is limited only by the accuracy required in this phase. It will vary with the specific application.

(3) Iterative computation: The iterative computation is used to account for the effects that circuits have on each other. If $f_1(X_1, X_2) = 0$ represents the set of equations of circuit 1, where $X_1$ is the vector of voltages and currents internal to circuit 1 and $X_2$ is the vector of voltages and currents internal to circuit 2, and if $f_2(X_1, X_2) = 0$ represents the equations of circuit 2, we (1) assign a "predicted" value $X_2^P$ to $X_2$ and obtain $$f_1(X_1, X_2^P) = 0;$$

(2) calculate $X_1$ from the equations of step one to obtain a calculated value $X_1^C$ for $X_1$;

(3) using the calculated $X_1^C$, calculate a new value for $X_2$ from $f_2(X_1^C, X_2) = 0$ to obtain a calculated $X_2^C$; and (4) compare $X_2^P$ and $X_2^C$. If they are within a given amount of each other, accept $X_1^C$ and $X_2^C$ as correct; if they differ by more than the given amount, select a new predicted value $X_2^{PP}$ and repeat the above steps.

The MACRO Program

The preferred embodiment of this invention, as outlined above and described in complete detail in the appended FORTRAN listing, includes a new circuit analysis program called MACRO (Macromodular Analysis of Circuit Response and Operation). MACRO is a circuit analysis program for simulating circuits in the time domain. It computes actual circuit voltages and currents that show delays and distortions and is more efficient than prior art general circuit analysis programs. Its input language consists of two major types. One statement, called the MACRO model descriptor, defines the internal topology of a MACRO model. The other statement, called the MACRO connectivity statement, defines the interconnectivity of MACRO models. The MACRO blocks in MACRO include the NOR gate, NAND gate, COMPLEX gates (any combination of OR-AND-OR-INVERSION or vice-versa), transmission gate (single device), push-pull driver, tristate drivers, and feedback loops. The program has full non-linear capabilities with expressions, two dimensional, and three-dimensional tables available. MACRO utilizes known numerical techniques such as sparse matrix techniques, implicit integration and Newton schemes, and also employs new techniques which provide savings in computation. The two major new techniques are (1) macromodeling and (2) latency. Macromodeling is a method of obtaining a model of a circuit for representation at its terminals. Latency is an analytical technique which takes advantage of inactivity of the circuit. The benefits of macromodeling are chiefly in system storage requirements; latency provides substantial reductions in system computation time. The following major steps are performed in the preferred embodiment of MACRO:

Macromodeling steps:
a. Functional Oriented Symbolic Macromodel step, where the macromodel is derived symbolically for a basic digital function with multiple input devices.
b. Slope-Intercept multidimensional table step.
c. Multi-level iteration step, where convergence exists internal to each macromodel and in an external loop (Newton-Gauss Seidel).

Latency steps:
a. General latency where the basic latency criteria are applied for stimulus and response vectors for each macromodel.
b. Functional latency where latency is applied for each internal branch of the macromodel.
c. Local latency where latency is applied at the basic device level inside each macromodel.

In MACRO, we are dealing with macromodels (MM) each of which is described with an equation of the type $$f(x_I, x_E) = 0$$

where $x_I$ represent the internal variables and $x_E$ are the external (or connection) variables. The major steps of MACRO, and the purpose of various ones of the routines and subroutines which are part of MACRO, can now be described as follows.

1. Increase $t_n = t_{n-1} + \Delta t$. This is accomplished in the major routine FLOGIC (e.g. FNOR, FNAND, etc.).
2. Update the values of the input voltages of the MM. This is accomplished by YFET.
3. Check for general latency and call the control routine. This function is performed by XCNTR.
4. Make a prediction for $x_E^P$ from past values.
This is accomplished in MACRO in the major routine FLOAD. Depending on the loading type to which the MM is connected, $x_E^P$ will be determined. Also in FLOAD, $dx_E/dt$ are determined at $t_{n-1}$, the previous time.
5. Thus, we obtain $x_{Ii}$ for MM number i using $x_E^P$ and $(dx_E/dt)$ at $t_{n-1}$ using a local Newton-Raphson iteration. This step is performed inside the major routine XCALR. A number of substeps are, however, required corresponding to a number of secondary calculating routines.
6. Make a prediction for $x_I^P$ from past value. This is performed in XCALR.
7. Call FLOAD to obtain $x_E^P$ and $(dx_E/dt)$.
8. Obtain the time derivative of the input voltages. This is performed by YFET.
9. Apply functional latency on the branch of the MM.
10. Predict non-linear entries of device current and perturbation to obtain partial derivatives. This is accomplished in CCURR and FCURR for non-linear expressions, and in CRTB and TBSRCH for three-dimensional tables.
11. Apply local latency on each device.
12. Apply FOSMA to obtain values of voltages and currents internal to each MM. This basically corresponds to evaluating the internal Jacobian of the MM. $x_{Ii} = x_{Ii}^P - J_i^{-1}(x_{Ii}^P, x_E^P)f_i(x_{Ii}^P, x_E^P)$ where $J_i$ is the Jacobian of MM identification number i.
13. Check for convergence and repeat up to three iterations.
14. Reduce $\Delta t$ inside each MM, update using YFET and repeat.

Repeat above steps for MM (i+1). If $x_{Ei}$ of MM$_i$ is not within a tolerable error of $x_{Ei+1}$ of MM$_{i+1}$, repeat above steps.

A very much simplified logic flow diagram of the invention is shown in FIG. 7. Although the figure does not illustrate all of the details described above, it does help to depict the equivalence between implementations of the invention in special purpose hardware and programmed general purpose hardware.

The first stage of the logic flow shown in FIG. 7 is a preprocessing stage in which input data is put into proper form for the subsequent processing. The input data includes descriptions of the elements in each macromodel, including their interconnections; the interconnections among various macromodels; and the circuit equations which describe the circuitry. After the appropriate preprocessing, time and the number of the macromodel being analyzed are both initialized.

As shown in the next portion of FIG. 7, the system now enters the processor stage. A first macromodel is analyzed in accordance with the circuit equations and its description. If that macromodel is a low level macromodel with respect to another higher level macromodel, its linearized equations yield results that are used to linearize the equations of the higher level macromodel. If the levels of macromodels are greater than 2, this sequence continues until the highest level macromodel has been analyzed and its equations linearized. This represents the multi-level Newton technique discussed above. After all of the macromodels in a hierarchy (having 1 or more levels) have been analyzed, and if other macromodels still remain to be analyzed, i is incremented so the analysis of the next macromodel can commence. If all macromodels have been analyzed, then the connections among the macromodels are analyzed. After this is completed, the entire network has been analyzed for a particular moment in time. The results of the analysis are stored, the time is incremented to the next period, i is again initialized to be equal to 1, and analysis of the network continues.

FIGS. 8 and 9 illustrate some of the macromodels used in the preferred embodiment of this invention. FIG. 8 depicts the equivalent circuit utilized (in routine FNOR) for circuit analysis of a NOR circuit. FIGS. 9a, b and c depict three equivalent circuits utilized (in routine FNAND) to represent NAND circuits. The equivalent circuit of FIG. 9a shows a circuit in which parallel devices achieve the NAND function through summation of currents; FIG. 9b shows a circuit in which serial devices achieve the NAND function through summation of voltages; and FIG. 9c shows a combined parallel/serial circuit in which currents and voltages are both summed.

Figure 10:
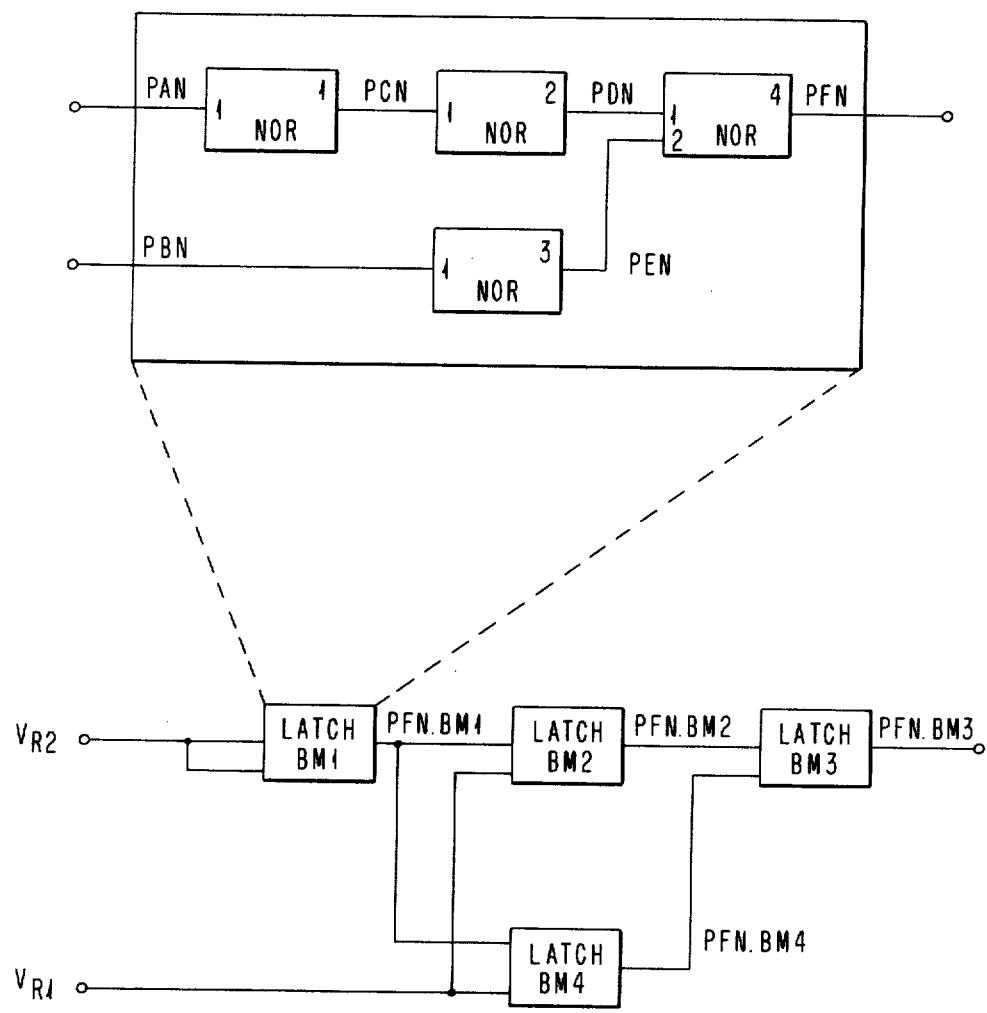
FIG. 10 is an illustration of an example of nesting of macromodels.

FIG. 10 provides a topological illustration of the input language used in MACRO. It also illustrates a three-level hierarchy of macromodels. The highest level macromodel consists of four latches, BM1, BM2, BM3, and BM4. Each latch is a macromodel consisting of four NOR gates. Each NOR gate is a lowest level macromodel described by an equivalent circuit such as the one shown in FIG. 8.

The network of FIG. 10 would be described in the MACRO input language as follows.

```
1   MODEL LOGIC ( )
2   BM1=MODEL LATCH ( ) (PAN=VR2,PBN=VR2,PA=0,AZ1=5,AZ2=1)
3   BM2=MODEL LATCH ( ) (PAN=PFN.BM1,PBN=VR1,PA=5,AZ1=9,AZ2=1)
4   BM3=MODEL LATCH ( ) (PAN=PFN.BM2,PBN=PFN.BM4,PA=0,AZ1=0,AZ2=0)
5   BM4=MODEL LATCH ( ) (PAN=PFN.BM1,PBN=VR1,PA=13,AZ1=9,AZ2=2)
6   MACRO LATCH ( )
7   PA=0,PAN=0,PBN=0,PCN=0,PDN=0,PEN=0
8   AZ1=0,AZ2=0,AZ3=0,...,AZ10=0
9   Z1=0,Z2=0,Z3=0,...,Z59=0
10  PCN=(FNOR(PA+1,PAN,PA+2,1))
11  PDN=(FNOR(PA+2,PCN,PA+4,1))
12  PEN=(FNOR(PA+3,PBN,PA+4,2))
13  PFN=(FNOR(PA+4,PDN,PEN,AZ1...,AZ10))
14  P1=(PFNOR(PA+1,Z1,...,Z10))
15  P2=(PFNOR(PA+2,Z11,...,Z21))
16  P3=(PFNOR(PA+3,Z22,...,Z46))
17  P4=(PFNOR(PA+4,Z47,...,Z59))
```

In the above listing, line 1 names the network and lines 2 through 5 define the interconnections among the four latches which comprise the network. For each latch, the sources of its two inputs, "PAN" and "PBN", are given; then the value of "PA" (a circuit identification number) and the values of AZ1 and AZ2 (the output connectivity of the circuits in the form of gate identification and device identification number, respectively) are given.

Line 6 indicates that the macromodel LATCH is being further defined and lines 7 through 9 initialize all terms at zero. Lines 10 through 13 then define the signals on outputs PCN, PDN, PEN and PFN (FIG. 10) to be NOR functions (FNOR) one through four (PA+1, PA+2, PA+3, PA+4, respectively). Lines 10 through 12 indicate that the first three NOR functions each has a single input, PAN, PCN, PBN respectively while line 13 indicates that the fourth NOR has two inputs, PDN and PEN. Lines 10 through 12 indicate that the outputs of the first three NOR functions go, respectively: to the second NOR, first input; to the fourth NOR, first input; and to the fourth NOR, second input. Line 13 indicates that the output of the fourth NOR exits from the macromodel to go elsewhere in the network.

Finally, lines 14 through 17 provide parameters for analysis of the four individual NOR circuits which are at the lowest level in the multi-level hierarchy of FIG. 10.

FNOR represents the logic description of the NOR gates and returns their output voltage responses. PFNOR represents the internal information of each gate such as, for example, resistance and capacitance values and power supplies.

Figure 11:
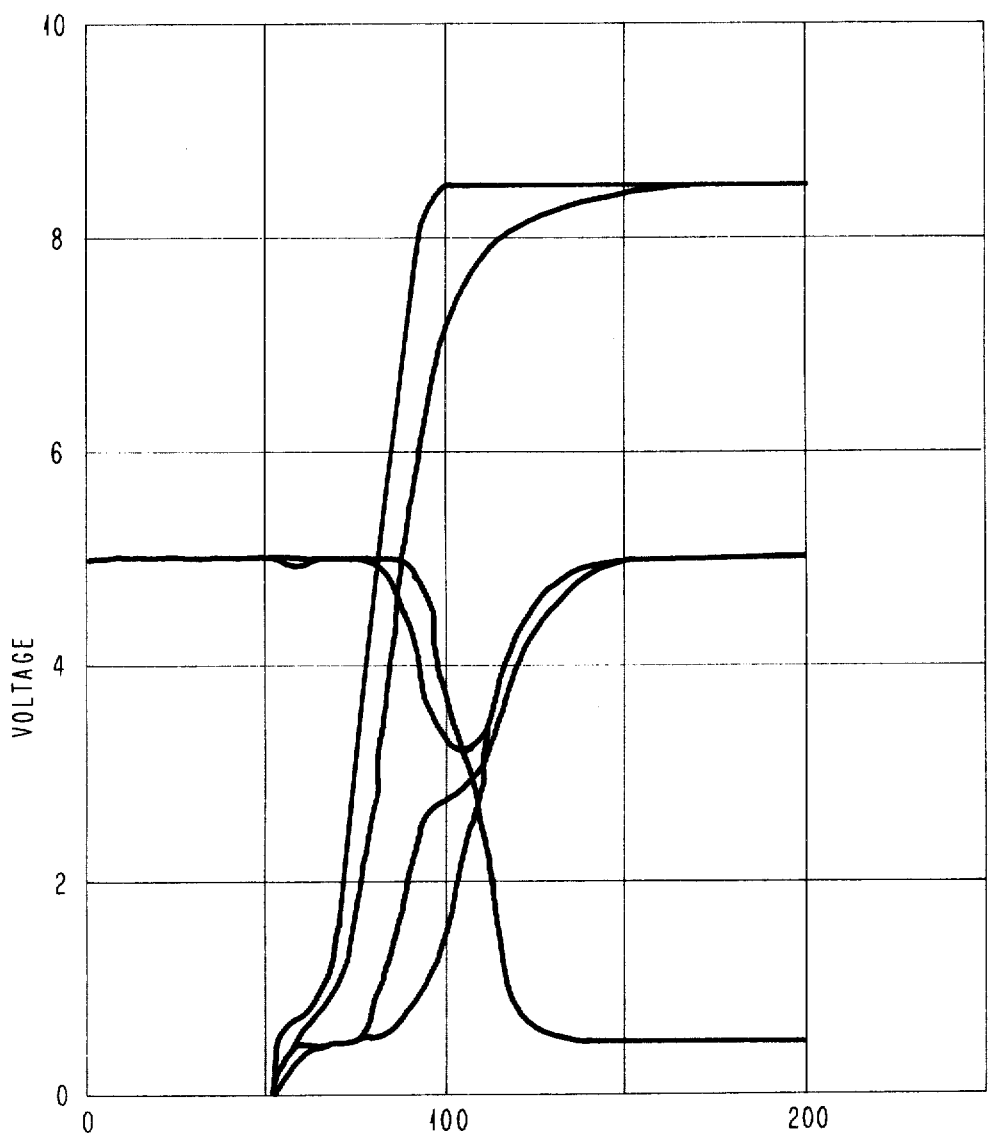
FIG. 11 is an example of output attainable with this invention.

FIG. 11 is an example of a graphical output obtainable from MACRO. The curves shown are a typical set of output responses (voltage versus time) of the internal nodes of a register circuit.

SPECIAL PURPOSE HARDWARE IMPLEMENTATION

Those skilled in the art recognize the equivalence between the programmed general purpose computer implementation described above and a special purpose hardware implementation. More specifically, those skilled in the art recognize that a logic flow diagram (similar to, but more detailed than, the one shown in FIG. 7) which describes the computer program also describes hardware which could be used to implement the invention. For this reason, it is clear that the descriptions contained above are totally sufficient to enable one of ordinary skill in the art to build and use a special purpose hardware embodiment of the invention.

With this in mind, the following material is presented as a guide which would help in the selection of a preferred manner of implementing the invention in special purpose hardware.

All units of a hardware implementation should be designed so that assembling them into a total system presents no logically irrelevant problems such as excessive circuit loading, waveform deterioration, signal propagation delay, power supply interactions, and so forth, regardless of the size or complexity of the system. The units should preferably be powered and controlled individually, and all possible signal paths must be capable of driving all possible loads.

Control within the system is preferably asynchronous. That is, each event in a sequence of events is initiated by the completion signal from a preceding event. The simplest way of accomplishing this is to connect a cable from a completion terminal associated with each operation to an initiation terminal associated with the next operation. This scheme, though simple and effective, has the limitation that once the control terminals for an operation have been connected for one sequence, it is no longer possible to incorporate the operation into any other sequence. In such cases, rather than connect to the terminals associated with the operation, we can connect instead to the terminals of a "calling element" associated with the operation. Since any number of calling elements may call the same operation, an operation may thus occur in as many distinct sequences as necessary. Such a system is suggested in the schematic diagram of FIG. 12 in which there are two calling elements 1 in addition to three operation elements 2.

Figure 12:
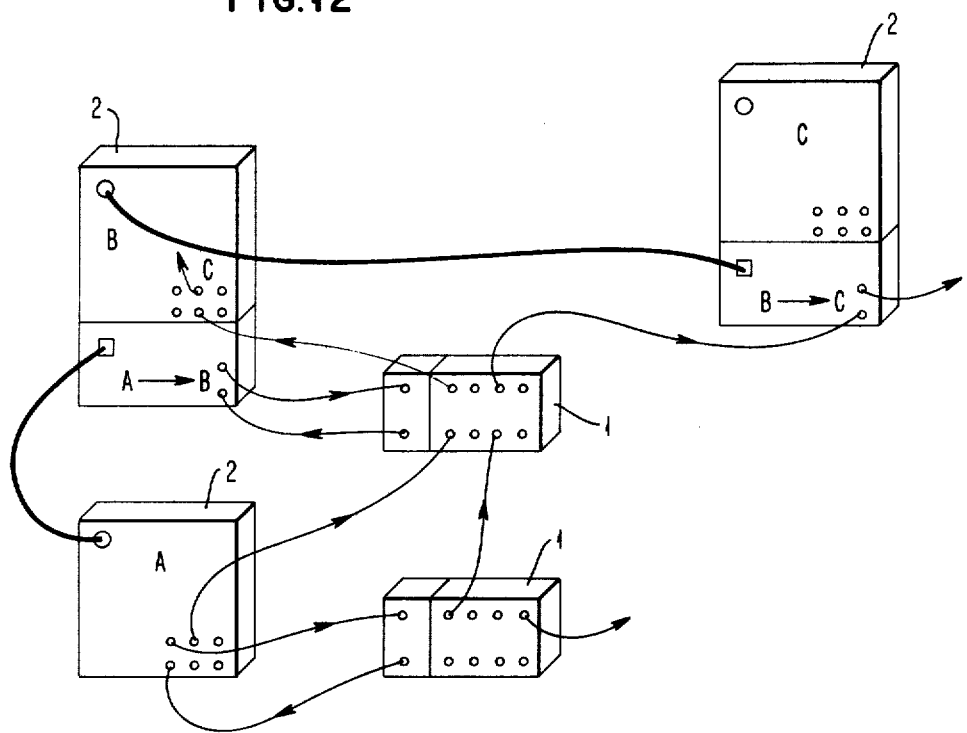
FIG. 12 illustrates connections used in a hardware embodiment of the invention.

The system shown in FIG. 12 can be viewed in terms of logically distinct, interacting networks. The processing network (the heavy-lined structure) consists of data processing elements interconnected by data pathways, and provides for storage propagation, and transformation of data within a system. The sequencing network (light-lined structure) consists of control nodes distributed throughout the system, interconnected by control pathways. The structure of the processing network defines the basic data processing operations of the system while the structure of the sequencing network defines the order in which subsets of these basic operations can be carried out.

Figure 13:
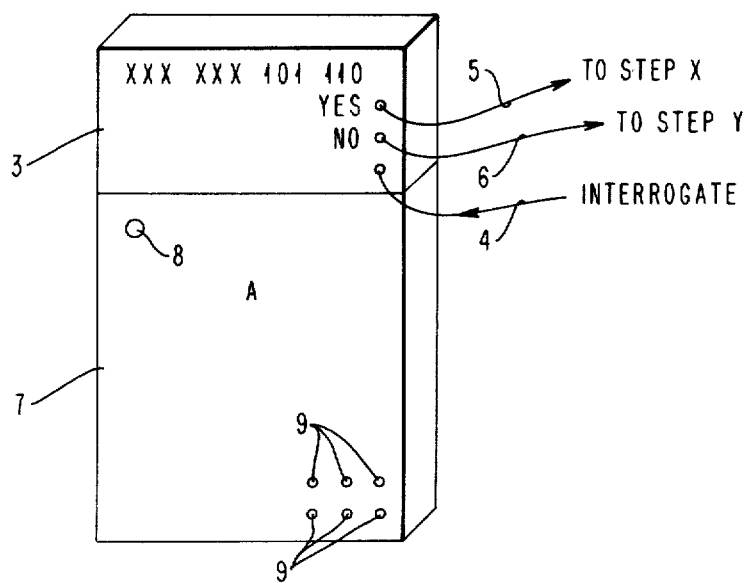
FIG. 13 shows details of one of the blocks in FIG. 12.

Interaction between these networks takes place at control terminals on the data processing elements. These terminals have two functions: (1) they allow the sequencing network to initiate operations, and (2) they return completion signals when the operations are finished. Each basic data processing operation has an associated set of these terminals, the number of terminals in the set being determined by the nature of the operation. Operations that manipulate data (data operations) have two, an initiation terminal and a completion terminal. Operations that check data for specific values (decision operations) will generally have more than two, one of which initiates the operation while the others (completion terminals) indicate the value of the data found. In FIG. 13, the upper portion 3 of the block is a decision element. Its operation is initiated by an Interrogate line 4, and it has two completion terminals 5 and 6 labelled Yes and No, respectively. The lower portion 7 of FIG. 13 represents a time continuous transformation element. This element, unlike those already described, performs its operation continuously. The data presented at its output 8 changes directly in response to changes at its inputs 9 rather than in response to control signals, and as a result, the element has no control terminals at all.

The order or sequence in which operations are performed is determined entirely by the structure of the sequencing network. This network is composed of signal nodes, calling elements, and inter-connecting pathways. A signal node is an element which provides for the merging or branching of control signals. A calling element is one which, when activated by a control signal at its initiation terminal, causes an operation to take place and, when signaled of completion of the operation, produces its own completion signal in turn. An operation node is a calling element for data operations, and a decision node is a calling element for decision operations.

Each element in the system contains all of the electronic circuits and memory required for the performance of its particular function. Data processing elements are organized in parallel binary form with a word-length of, for example, 32 bits, and are designed functionally for asynchronous operations. Memory modules may hold, for example, 6400 32-bit words.

The following sections provide additional descriptions of various operation elements that could form a preferred special purpose hardware embodiment.

REGISTER ELEMENT

The basic register element contains a 32-bit register together with logic for the operations clear, complement, and index (count). Mounted on the register element are control terminals for these operations and a data output terminal.

Registers of any length can be formed by concatenating register elements. Only the rightmost element will have control terminals, and these terminals will provide control for the whole register. (This feature is preferably common to all data operation and decision operation elements, thereby making control of an operation independent of register size. Special circuits within each element would be coupled so as to guarantee proper operation regardless of register length.)

DATA GATE ELEMENT

Data transfers from one register to another require the use of a data gate element. This element is connected by means of a data cable to the output of a data source register element. Thirty-two bits are transferred in parallel, and the transfer initiation and completion terminals appear on the data gate element. Transfers do not alter the information at the source. If a register element is to receive input from n sources, n data gates are required. Data gate elements can be concatenated to provide for transfers into longer registers.

BRANCH ELEMENT

In order to permit the transfer of information from a single source into more than one destination, a data branch element is used. Data branch elements can preferably be cascaded indefinitely to provide any number of connections to the same source.

MEMORY ELEMENT

The memory element has a capacity of 6400 32-bit words and contains, in addition to a memory array, all required drivers, addressing logic, sense amplifiers, internal address and data registers, etc.

Reading is controlled by a pair of terminals on the memory element. The memory element data output terminals can be connected so that a word read from the memory array is transferred into a particular register. The read operation's completion signal, or any subsequent signal, can be used to initiate the transfer operation.

Writing into the memory preferably can take place from an arbitrary number of sources. For this purpose data gate elements would be stacked just as for register transfers. Writing from each source would be controlled by the terminals on the corresponding data gate.

Memory elements can be plugged together laterally to increase word length, and vertically to increase the number of words. To permit referencing in systems containing more than 6400 words, connectors should be provided for additional address inputs for selection of the appropriate array.

SHIFT ELEMENT

Two types of shift operations are defined, shifting right and shifting left. A 36-bit register designed to shift in either direction can provide these operations.

The shift element preferably has five pairs of control terminals, each of which causes the register to shift one position. However, each pair treats the incoming bit at the trailing end of the register differently. The options are:

(1) the bit is not changed;
(2) the bit is replaced with the bit previously at the other end of the register, i.e., a rotation occurs;
(3) the bit is set to the value "0";
(4) the bit is set to the value "1";
(5) the bit is taken from the data input port at the trailing end of the register. For leftward shifting the bit is taken from the most significant bit position of the input; for rightward shifting, from the least significant position. (The remaining 11 bits of information at the data input are not used.)

ADDER ELEMENT

The adder element takes one input from an internal register and the other input from a data input port on the adder. The sum is placed into the internal register. The adder unit preferably contains three decision nodes which provide for the detection of overflow, negative result and the numerical zero sum.

LOGIC ELEMENT

A logic element can perform any of three logical operations on a pair of data inputs. Like the adder, one of the data inputs comes from an internal register and the other from a data input port on the unit. The result of the operation is returned to the internal register. The operations, controlled by three pairs of terminals on the unit, are the logical OR, the logical AND, and the EXCLUSIVE-OR.

Figure 14:
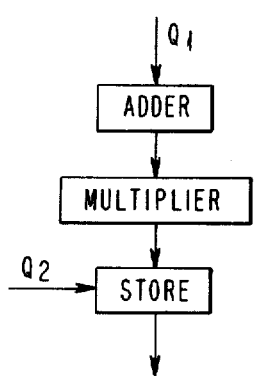
FIGS. 14 thru 18 show further aspects of particular elements that may be utilized in a hardware embodiment of the invention.
Figure 15:
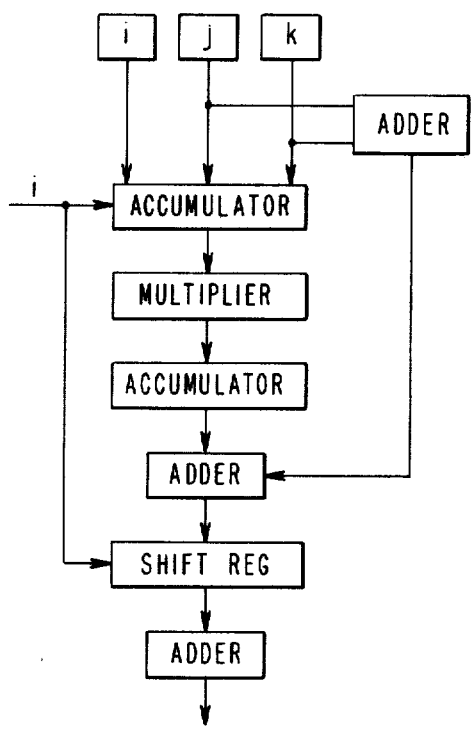
Figure 16:
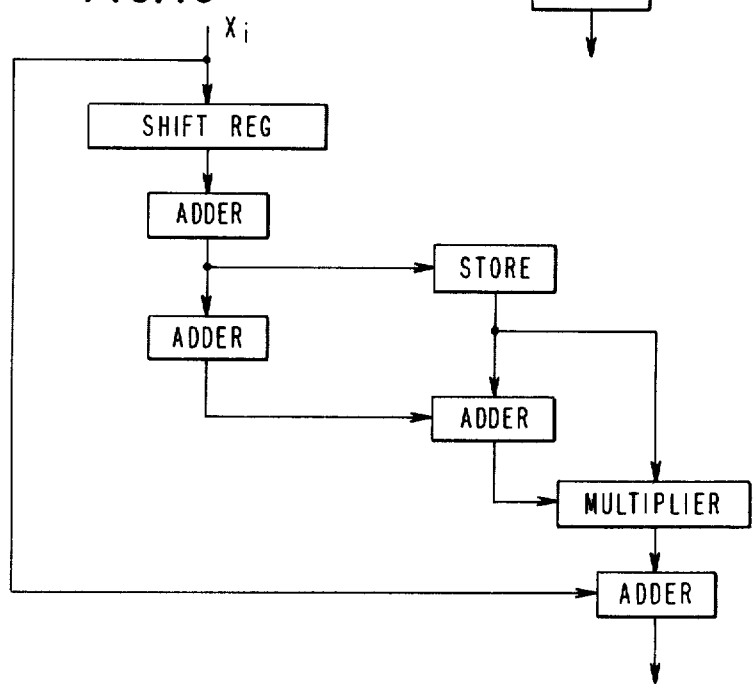
Figure 17:
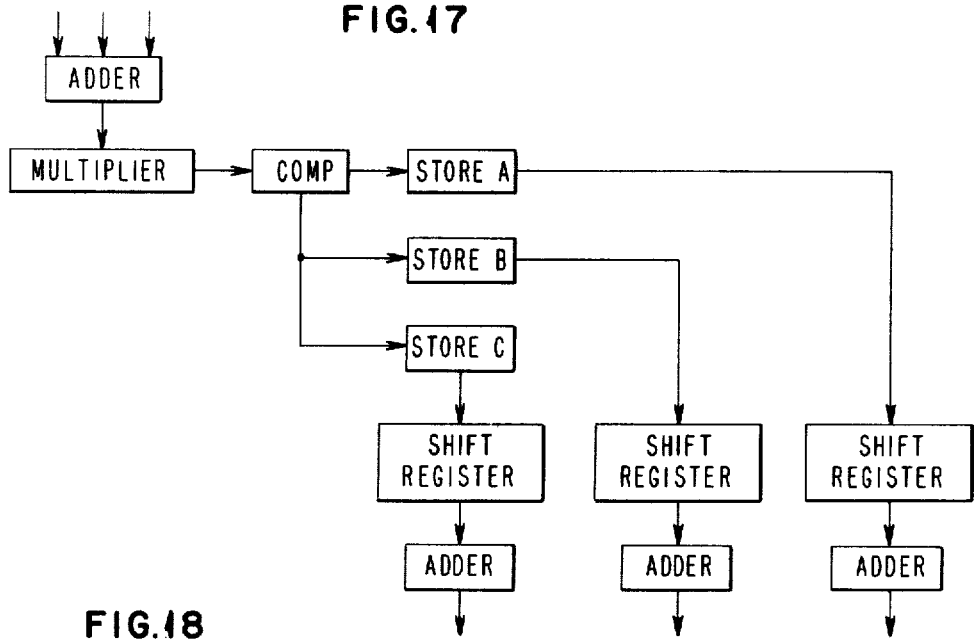
Figure 18:
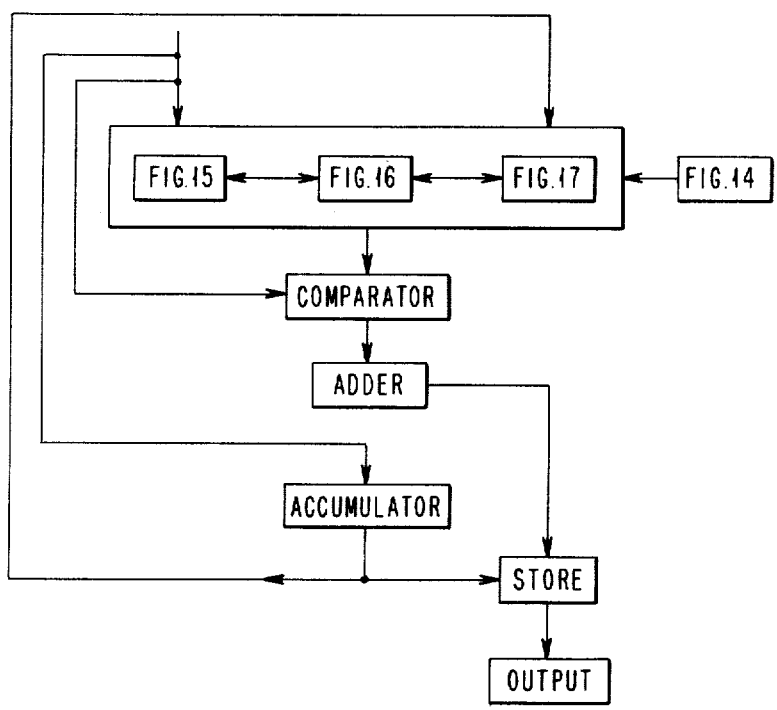
Figure 19:
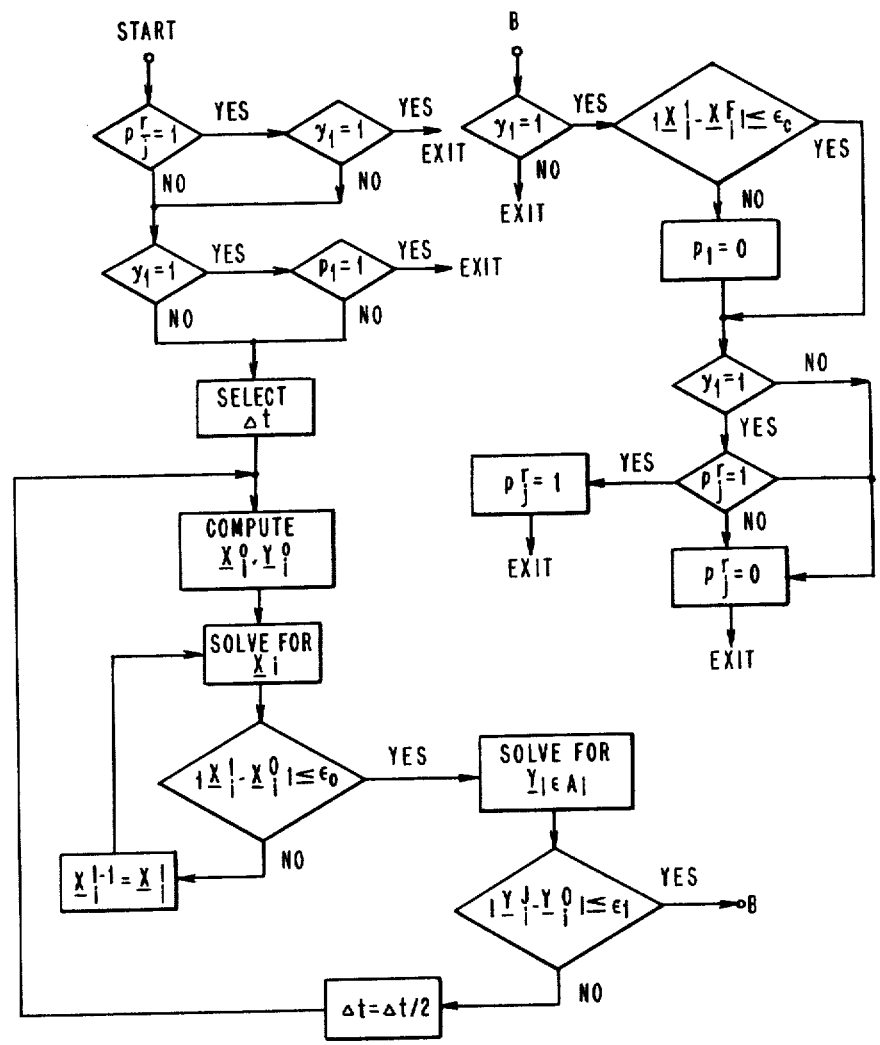
FIGS. 19 and 20 are logic flow diagrams illustrating the invention.
Figure 20:
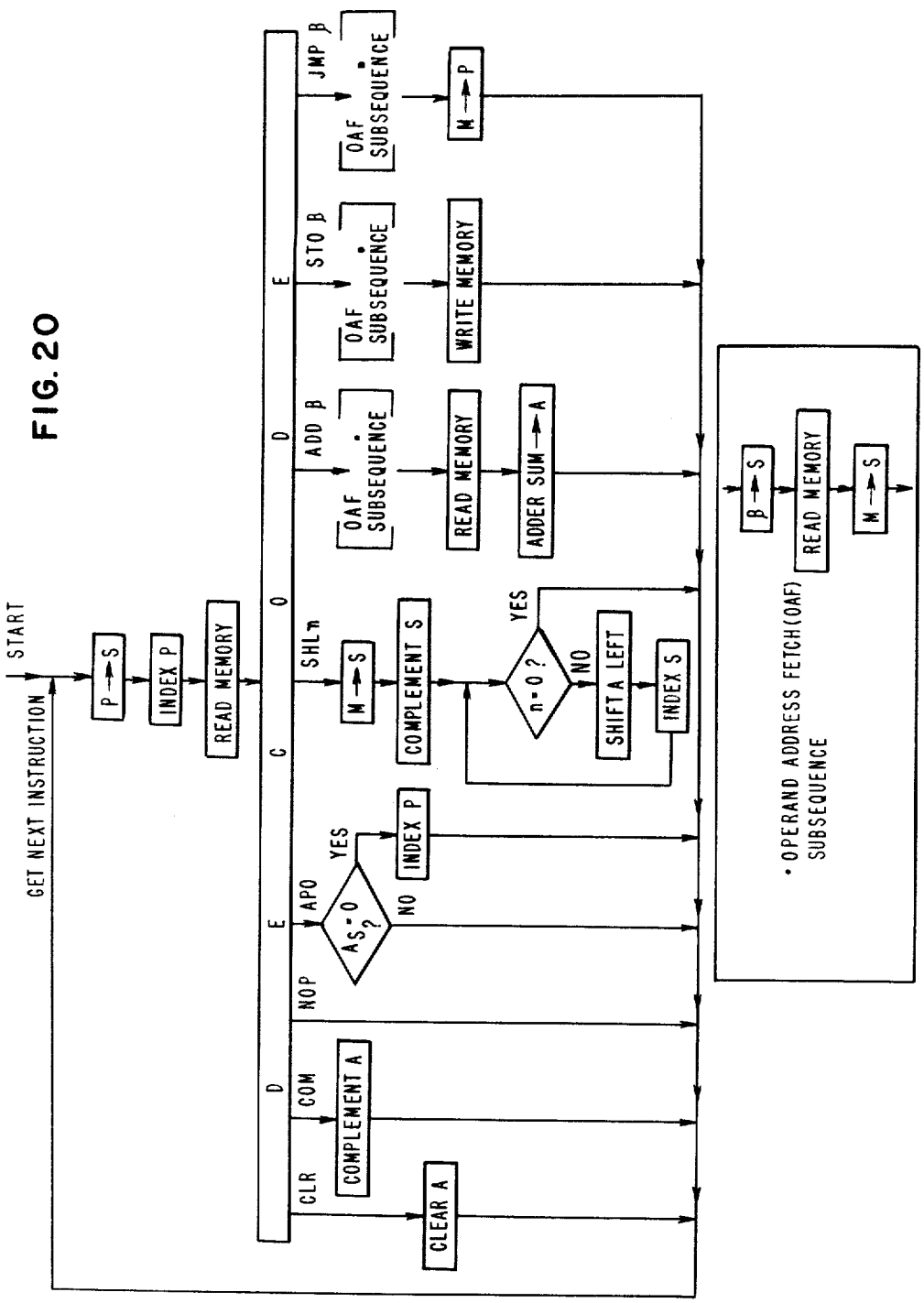
Figure 21:
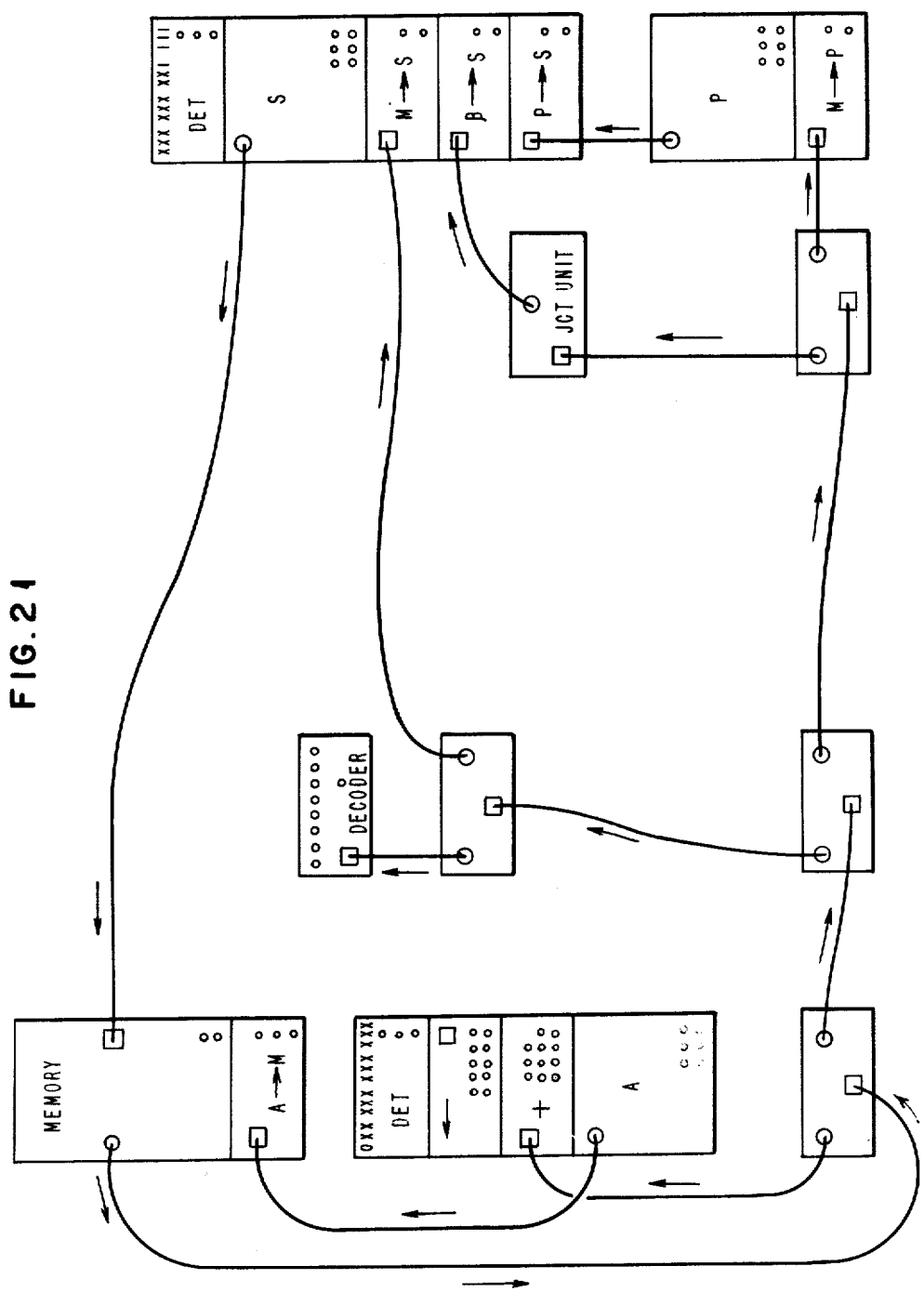
FIGS. 21 thru 24 show the four control phases of one hardware implementation of the invention.
Figure 22:
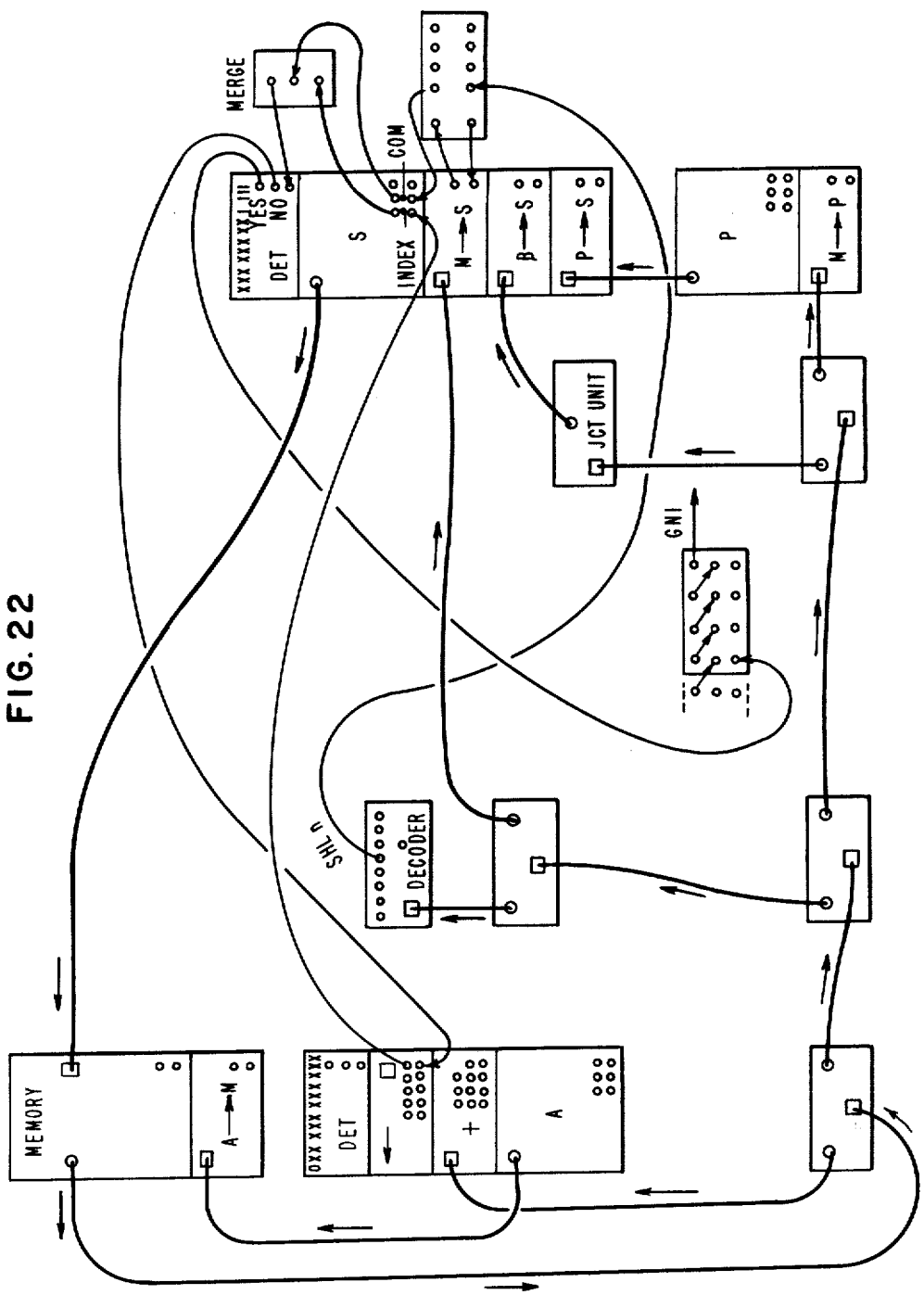
Figure 23:
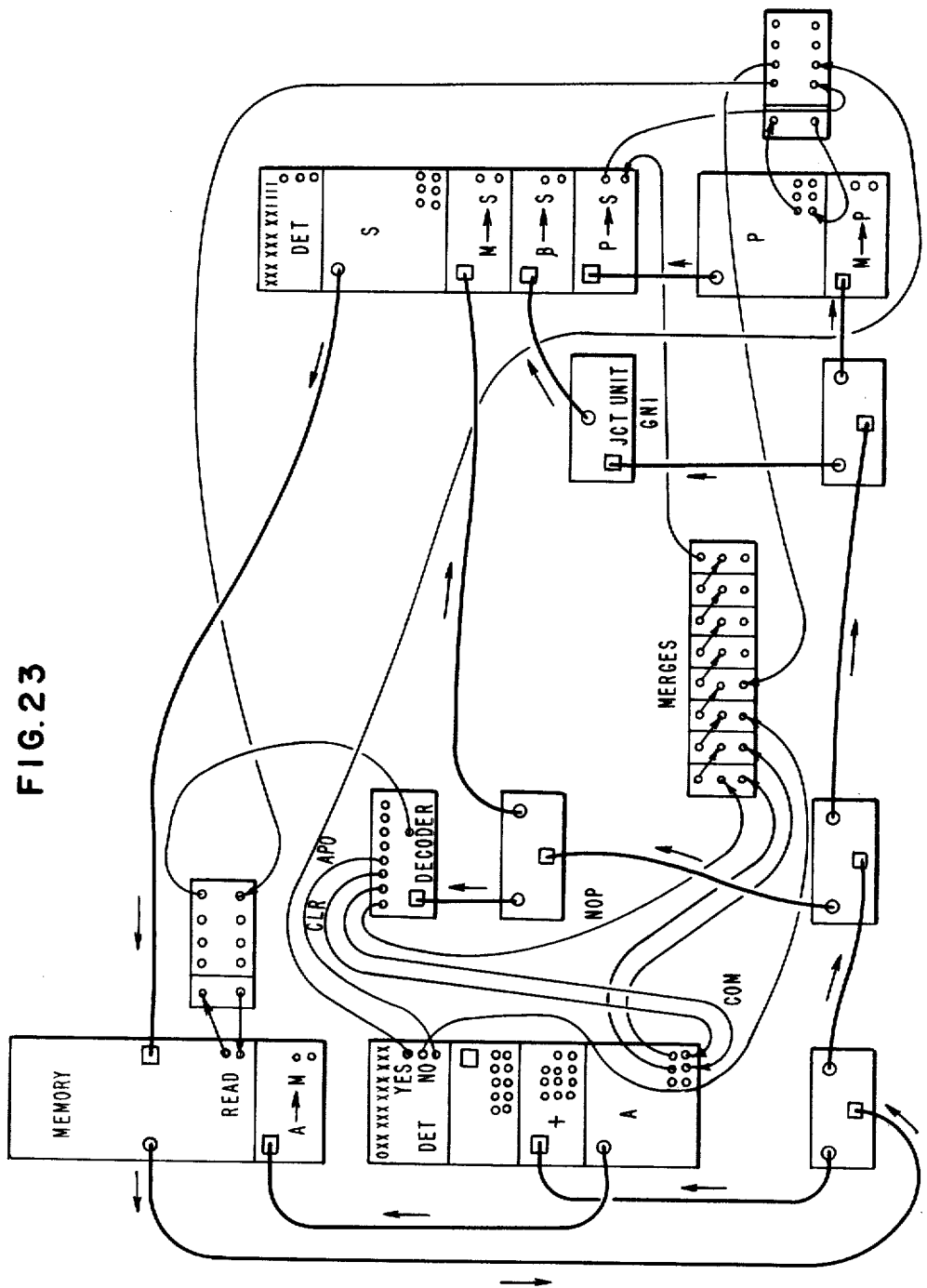
Figure 24:
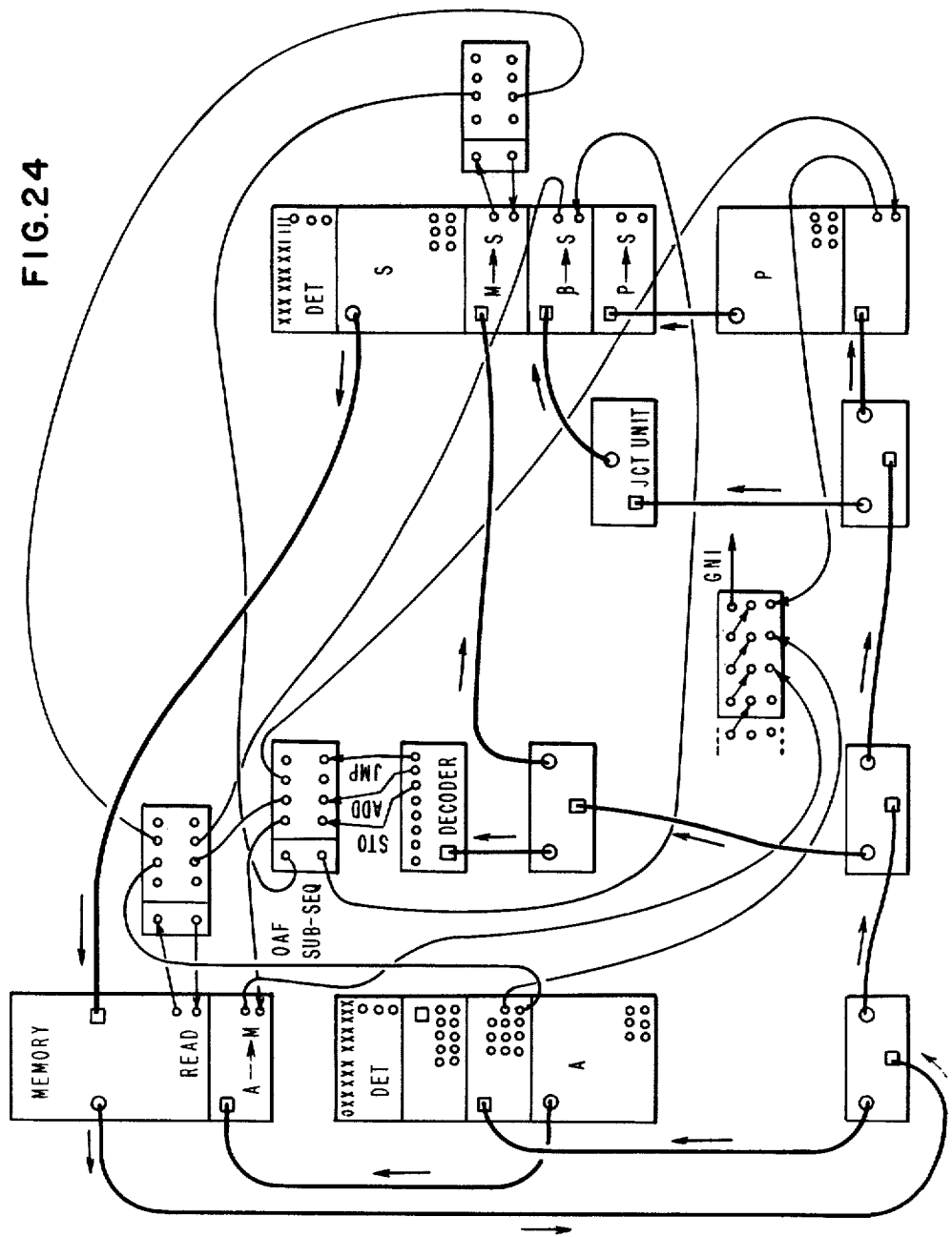

The above descriptions can be merged into an exemplary hardware implementation. We are dealing with macromodels each of which is described by some F(XI, XE), where XI represent internal variables and XE represent external (or connection) variables. The major steps to be performed by the hardware are:

1. Increase TN=(TN−1)+DT, where TN is the discretized time argument and DT is the increment.
2. Check for general latency.
3. Obtain XE from hardware such as is shown in FIG. 14. XE corresponds to a prediction of values at previous time, as well as the difference between prerims and actual values, DXE, divided by DT. That is, it is the time derivative.
4. Obtain XI using symbolic LU factorization, Newton-Raphson and implicit integration utilizing hardware such as is shown in FIGS. 15, 16 and 17, respectively.
5. Solve the total XI using XE using hardware such as is shown in FIG. 18.
6. Repeat above steps as shown in the flow chart of FIG. 19. The flow chart of FIG. 19 corresponds to the hardware logic flow shown in FIG. 20 which, in turn, corresponds to the four phases needed to obtain the implementation of FIGS. 21, 22, 23 and 24.

A complete listing of the MACRO program that is a preferred embodiment of this invention is included in the official Patent Office file of this patent.

While preferred embodiments of the invention have been illustrated and described, it is to be understood that the invention is not limited to the precise constructions herein disclosed and the right is reserved to all changes and modifications coming within the scope of the invention as defined in the appended claims.

Having thus described our invention, what we claim as new, and desire to secure by Letters Patent is:

1. A system for performing a circuit analysis of a network, said system comprising:
    input means for receiving circuit data providing information as to the topology and parameters of the network to be analyzed;
    partitioning means for dividing said network into subnetworks;
    macromodeling means for assigning to each of a plurality of said subnetworks a macromodel circuit having nodes and branches;
    equation formulation means for providing for each of said macromodel circuits a respective set of circuit equations including specification of internal relationships and effects of external stimuli;
    initialization means for providing the initial voltage and current conditions of a plurality of said nodes and branches of each of said macromodel circuits;
    circuit analysis means for solving said sets of circuit equations for a predetermined instant in time; and
    means for incrementing said time repeatedly and for activating said circuit analysis means after each increment for solving said sets of equations for each time increment.

2. The system of claim 1 further including:
    latency detection means for signalling that successive solutions in time of the set of circuit equations for a particular macromodel circuit have varied by less than a predetermined amount; and
    means responsive to said signal to inhibit said circuit analysis means for solving the set of circuit equations related to said particular macromodel circuit until the occurrence of a predefined condition.

3. The system of claim 2 wherein said predefined condition is a change in the external stimuli related to said macromodel circuit.

4. The system of claim 1 or claim 3 wherein:
    at least one of said macromodel circuits includes within it another macromodel circuit.

5. The system of claim 1 or claim 3 wherein said circuit analysis means includes:
    first inter connection description means describing a first relationship between a first parameter of a first macromodel and a second parameter of a second macromodel;
    second interconnection description means describing a second relationship between said first parameter and said second parameter;
    prediction means for selecting a predicted value for said first parameter;
    computation means related to said first interconnection description means for generating, based upon said predicted value, a first computed value for said second parameter;
    further computation means related to said second interconnection description means for generating based upon said first computed value, a second computed value for said first parameter;
    means for comparing said predicted value with said second computed value and for producing an indication of the magnitude of the difference between them; and
    means responsive to said indication to cause said prediction means to select another predicted value if said magnitude of the difference exceeds a predetermined amount.

6. A method for performing a circuit analysis of a network, said method comprising:
    receiving circuit data providing information as to the topology and parameters of the network to be analyzed;
    partitioning said network into subnetworks;
    assigning to each of a plurality of said subnetworks a macromodel circuit having nodes and branches;
    providing for each of said macromodel circuits a respective set of circuit equations including specification of internal relationships and effects of external stimuli;
    providing the initial voltage and current conditions of a plurality of said nodes and branches of each of said macromodel circuits;
    solving said sets of circuit equations for a predetermined instant in time; and
    incrementing said time repeatedly and returning to said solving step after each increment to solve said sets of equations for each time increment.

7. The method of claim 6 further including:

detecting when successive solutions in time of the set of circuit equations for a particular macromodel circuit have varied by less than a predetermined amount; and in response to said detecting step, inhibiting the solving of the set of circuit equations related to said particular macromodel circuit until the occurrence of a predefined condition.

8. The method of claim 7 wherein said predefined condition is a change in the external stimuli related to said macromodel circuit.

9. The method of claim 6 or claim 8 wherein said solving step includes:

describing a first relationship between a first parameter of a first macromodel and a second parameter of a second macromodel;

describing a second relationship between said first parameter and said second parameter;

selecting a predicted value for said first parameter;

generating, based upon said first relationship and said predicted value, a first computed value for said second parameter;

generating, based upon said second relationship and said first computed value, a second computed value for said first parameter;

comparing said predicted value with said second computed value and producing an indication of the magnitude of the difference between them; and selecting another predicted value if said magnitude of the difference exceeds a predetermined amount.

* * * * *